United States Patent [19]

Lewyn et al.

[11] Patent Number: 4,500,846
[45] Date of Patent: Feb. 19, 1985

[54] CIRCUIT FOR EFFECTING IMPROVED SLEW RATE OF OPERATIONAL AMPLIFIERS

[75] Inventors: Lanny L. Lewyn, Palo Alto; Charles H. Lucas, Newport Beach, both of Calif.

[73] Assignee: Hughes Aircraft Company, El Segundo, Calif.

[21] Appl. No.: 486,644

[22] Filed: Apr. 20, 1983

[51] Int. Cl.$^3$ ............................ H03F 3/16; H03F 3/45
[52] U.S. Cl. ..................................... 330/253; 330/294
[58] Field of Search ..................... 330/9, 51, 107, 253, 330/294

[56] References Cited

PUBLICATIONS

Jenkins, J. O. M., "Reduction of Amp Offset & Drift", *Elec. Engring.*, vol. 48, No. 586, p. 19, Dec. 1976.

Primary Examiner—James B. Mullins
Assistant Examiner—Steven J. Mottola
Attorney, Agent, or Firm—Charles D. Brown; A. W. Karambelas

[57] ABSTRACT

An improved output circuit for an operational amplifier which is controlled to operate in one of two modes. In the first mode, the output of the operational amplifier tracks a reference signal or ground. In the second mode, the output of the operational amplifier tracks the level of a time varying second voltage signal. The improvement consists of replacing the stabilization capacitor of prior art output circuits with a pair of stabilization capacitors connected in parallel. Each of the pair of capacitors has an associated series connected switch for switching the capacitor into and out of the circuit. The switches are operated by a respective one of a pair of external non-overlapping clock pulse trains so as to not be closed simultaneously. The effect of this improved output circuit is to allow the output voltage of the operational amplifier to slew rapidly (or snap) up to the last previous level of a sampled input voltage (or a predetermined second reference voltage) thereby minimizing the effects imposed by the limiting of the first stage slew rate. Thus, slewing begins at a higher rate, governed primarily by the higher slew rate capability of the output stage, and consumes less time. In addition, the output voltage will snap directly from the level of the sampled time varying second voltage to the reference voltage level at the same high slew rate of the output stage. Because the voltage difference through which the stabilization capacitor must charge is greatly reduced, the output is able to reach and track the time varying voltage more rapidly than can prior art devices. The output of the operational amplifier thus shows greater correlation with the level of the second or time varying signal.

8 Claims, 7 Drawing Figures

CIRCUIT FOR EFFECTING IMPROVED SLEW RATE OF OPERATIONAL AMPLIFIERS

BACKGROUND OF THE INVENTION

1. Field of the Invention

This invention relates to the design of operational amplifiers and, in particular, to the design of the output stage of operational amplifiers intended to provide an output voltage which switches (or alternates) between a first output reference voltage and a second output signal voltage level. The signal voltage may be time varying.

2. Description of the Prior Art

The use of operational amplifiers to switch between output voltage levels is known. Such operational amplifiers require a specific amount of time to make the transition from one output voltage level to another output voltage level. The required time interval is commonly divided into two sub-intervals, the slewing time interval and the settling time interval.

The rate at which the output voltage of an operational amplifier changes from a first level to a second level during the slewing time interval is called the slew rate dV/dt. The slew rate is limited to a maximum value determined by the input stage bias current $I_1$ and the size of the internal stabilization capacitor (Cs). The maximum value of the slew rate is known as the first-stage slew rate limit and may be expressed as $dV/dt = I_1/Cs$. In presently known operational amplifiers which are required to switch from a first voltage level to a second voltage level, the first voltage level may be a reference level such as ground or the offset voltage of the differential input stage of the operational amplifier. The second voltage level may be a specific time varying voltage level which the operational amplifier is required to provide at its output. Thus, as the value of the time varying voltage increases, it takes the operational amplifier longer to slew from the ground or reference voltage level to the level of the second or time varying voltage. The longer the time required to slew to the desired voltage level, the less time is available (during a given clock period) for the settling time interval, during which the amplifier output voltage may settle to a value approaching that of the desired output voltage.

SUMMARY OF THE INVENTION

The invention is an improved output circuit for an operational amplifier which is controlled to operate alternately in each of two modes. In the first mode, the output of the operational amplifier is reset to a reference signal or ground. In the second mode, the output of the operational amplifier samples the level of a time varying second voltage signal. The improvement consists of replacing the stabilization capacitor of prior art output circuits with a pair of stabilization capacitors connected in parallel. A series connected switch is associated with each capacitor for switching the associated capacitor into and out of the circuit. The switches are operated by a respective one of a pair of external non-overlapping clock pulse trains so as to not be closed simultaneously. The effect of this improved output circuit is to allow the output voltage of the operational amplifier to snap up to the last previous level of a sampled input voltage at a rate which is not restricted by the first stage slew rate limit. Thus, slewing begins at a higher rate, limited only by the output stage slew rate capability. The slew interval will therefore consume less time. Because the time interval during which the output slews is greatly reduced, the output has more time to settle and track the time varying voltage than in prior art devices. The output of the operational amplifier thus shows greater correlation with the level of the second or time varying signal.

DETAILED DESCRIPTION OF THE INVENTION

Figure 1:
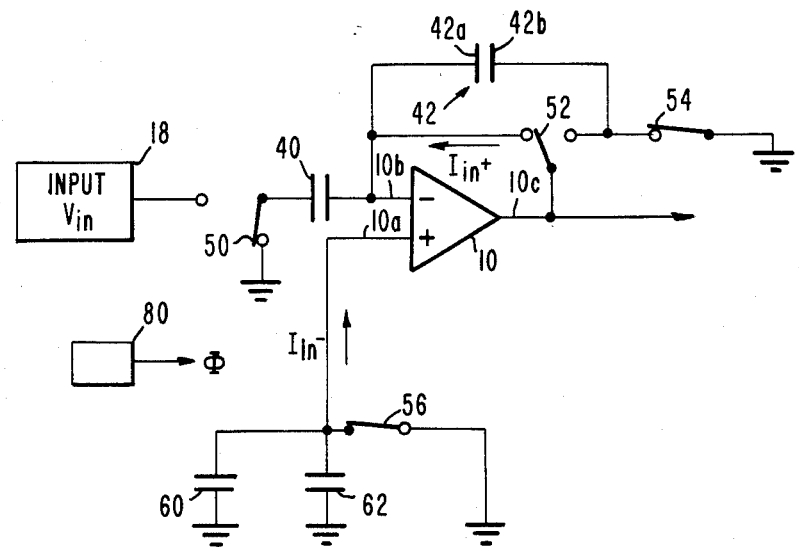
FIG. 1 illustrates the typical circuit environment in which the present invention is intended to operate.

The environment in which the circuit of the present invention is intended to operated is typified by the circuit shown in FIG. 1. That circuit is a simplified circuit diagram of an insulated gate field effect transistor (IGFET) circuit formed on a semiconductive substrate for performing a sample and reset function. This circuit is the subject of a copending patent application of Lucas et al, Ser. No. 316,453, filed Oct. 30, 1981, titled "Sample and Hold Circuit with Improved Offset Compensation". That application is assigned to the same assignee as is the present application. A detailed explanation of the circuit of FIG. 1 may be found in the referenced copending application. Only an abbreviated explanation will be given herein.

The switch 50 permits alternate connection of the input capacitor 40 to the input voltage source 18 and ground. The switch 52 permits the alternate connection of the amplifier output 10c to the amplifier inverting input 10b and to plate 42b of the feedback capacitor 42. The switch 54 permits connection of the feedback capacitor plate 42b to ground. When the circuit is operating in the "reset" mode, the switch 50 is connected between ground and the input capacitor 40, and the switch 52 is connected between the output 10c and the inverting input 10b while the switch 54 is closed to connect the feedback capacitor plate 42b to ground. When the circuit is in the "sample" mode, the position of all of the switches 50, 52, 54 is reversed so that the switch 50 connects the input voltage source 18 to capacitor 40, the switch 52 connects the amplifier output 10c to the feedback capacitor plate 42b, while the switch 54 disconnects the feedback capacitor plate 42b from ground.

The switch 56 is operated during the "sample" mode to disconnect the positive amplifier input 10a from ground leaving the positive amplifier input connected to the capacitors 60 and 62. The value of capacitors 60 and 62 are selected to be proportional to the value of capacitors 40 and 42, respectively. The purpose of the capacitors 60, 62 is to provide compensation for the leakage currents $I_{in-}$ and $I_{in+}$ which leak through the switches 56 and 52, respectively, during the "sample"

mode. Typically, each of the switches 52, 56 is formed as a metal oxide semiconductor field effect transistor (MOSFET). Such a switch typically has junction leakage which is a well-known problem in the art and causes the leakage currents $I_{in-}$ and $I_{in+}$.

By omitting switch 54 and operating switches 50, 52 as described above, but in synchronism with a clock signal $\Phi$ of frequency $f_c$ derived from a clock signal generator 80, the circuit of FIG. 1 becomes a switched capacitor integrator. By reversing the phase of the clock signal controlling switch 50, the circuit of FIG. 1 becomes a sample and hold circuit.

Figure 2:
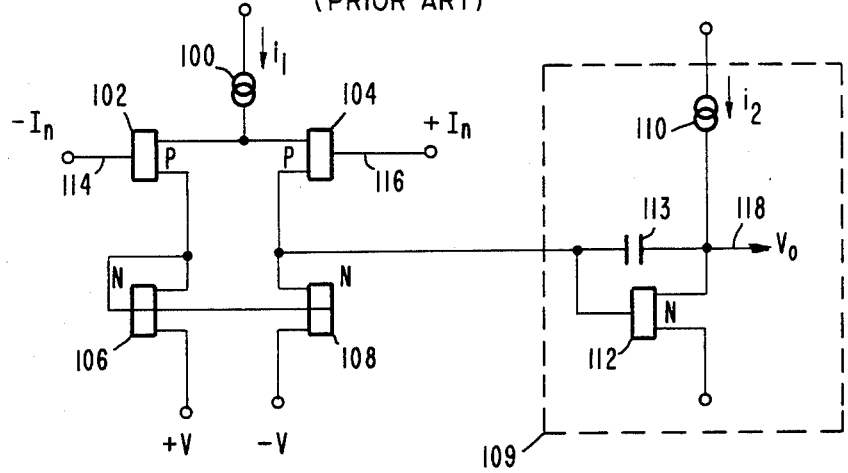
FIG. 2 is a schematic diagram of prior art circuitry used within the operational amplifier contained in FIG. 1.

Internal to the operational amplifier 10 is circuitry typified by that shown in FIG. 2. That circuit comprises a first current source 100, a pair of P-type FETs 102, 104 forming the differential input, a pair of N-type FETs 106, 108 forming a current mirror, and an output stage 109 comprising a second current source 110, an N-type FET 112 and a stabilization capacitor 113. The inverting input terminal 114 and the positive input terminal 116 correspond respectively to the input terminals 10b and 10a of op amp 10 of FIG. 1. Output terminal 118 provides the output signal and corresponds to terminal 10c of FIG. 1.

Figure 3:
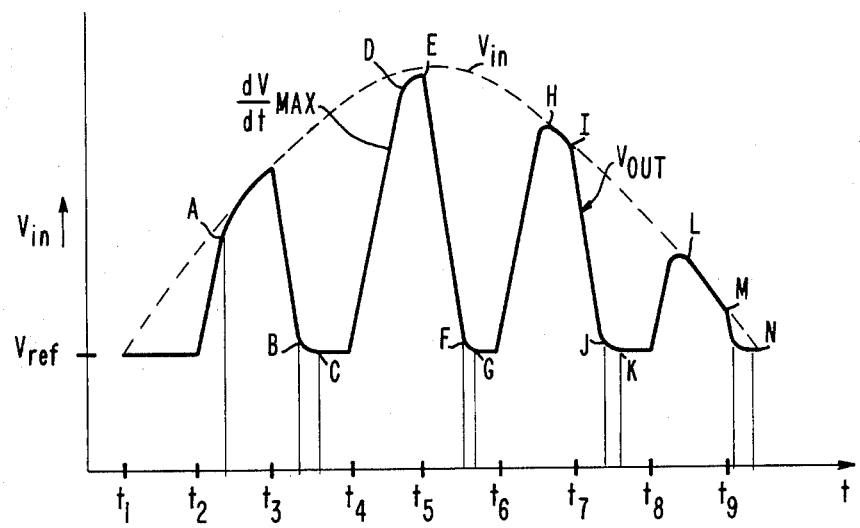
FIG. 3 is a diagram of the output waveform resulting from use of the circuit of FIG. 2.

If the internal circuitry of the op amp 10 is as shown in FIG. 2, then the circuit of FIG. 1 may be operated in a sample and reset mode to give the output waveform $V_{out}$ as shown in FIG. 3 when the input waveform is sinusoidal such as $V_{in}$. When the circuit is not in the sample mode, the output voltage returns to the reset level of $V_{ref}$ which is typically the offset voltage of the op amp. As shown in FIG. 3, $V_{out}$ is at $V_{ref}$ for the time interval $t_1$ to $t_2$. During the sample time interval $t_2$ to $t_3$, the output $V_{out}$ ideally should track $V_{in}$. However, $V_{out}$ can rise only at the maximum slew rate $dV/dt$ set by the input stage bias current $I_1$ from source 100 and the size of the stabilization capacitor 113 (Cs). The maximum rate $dV/dt$ max is expressed as $I_1/Cs$ and is commonly referred to as the input stage slew rate limit. $V_{out}$ will rise at this maximum slew rate until it nears $V_{in}$ as indicated at A in FIG. 3. Thereafter, $V_{out}$ will settle toward $V_{in}$ until the time $t_3$. At time $t_3$, $V_{out}$ would ideally switch to $V_{ref}$ and remain there until $t_4$. However, $V_{out}$ can only slew toward $V_{ref}$ at a rate of $-dV/dt_{max}$. $V_{out}$ thus begins to slew downward toward $V_{ref}$ and continues to slew at the maximum rate until it reaches point B where it begins to settle into the level $V_{ref}$. The time period between B and C is referred to as the settling time of the waveform $V_{out}$. From point C to time $t_4$, the output $V_{out}$ tracks $V_{ref}$. At time $t_4$, the switching circuitry again places the circuit of FIG. 1 in the sample mode. $V_{out}$ thus begins to rise at the rate $dV/dt$ max. Since $V_{in}$ has now reached a higher level, $V_{out}$ must slew for a longer time period, i.e., slews from $t_4$ to point D. This time span is significantly longer than the time span $t_2$ to point A. Because it takes so long to approach the level of $V_{in}$, $V_{out}$ cannot reach $V_{in}$ during the period D to E. Similarly, for the sample period $t_6$ to $t_7$, $V_{out}$ actually tracks $V_{in}$ only for the time span from point H to point I. For the sample time $t_8$ to $t_9$, the lower level of $V_{in}$ permits $V_{out}$ to track for a relatively long period of time between point L and $t_9$. In general, the higher the voltage level of $V_{in}$, the longer is the slew time, and the less time there is available to actually settle to and track the desired voltage $V_{in}$ or $V_{ref}$.

The present invention is a switching circuit, intended to modify the output stage 109 of the circuit of FIG. 2. On the average, the invention reduces the time required to slew to the level of $V_{in}$, thereby leaving a greater portion of the sample or reset periods available for actually tracking either the input voltage $V_{in}$, or the reference voltage $V_{ref}$, as appropriate. The modification to the circuit is illustrated by the output stage 109' of FIG. 4.

The disadvantages of the circuit of FIG. 2 stem from the fact that a single capacitor is required to switch between both the reference level $V_{ref}$ and the input signal $V_{in}$. Before the single capacitor 113 can track one signal, it must charge or discharge from the voltage retained when tracking the other signal. In the improved circuit of FIG. 4, one capacitor, e.g., 123, is dedicated to tracking $V_{in}$ and another capacitor, e.g., 125, is dedicated to tracking the other voltage level $V_{ref}$. Thus, neither capacitor is required to track both $V_{out}$ and $V_{ref}$; each is free to retain the last achieved voltage level of the signal which it tracks.

Figure 4:
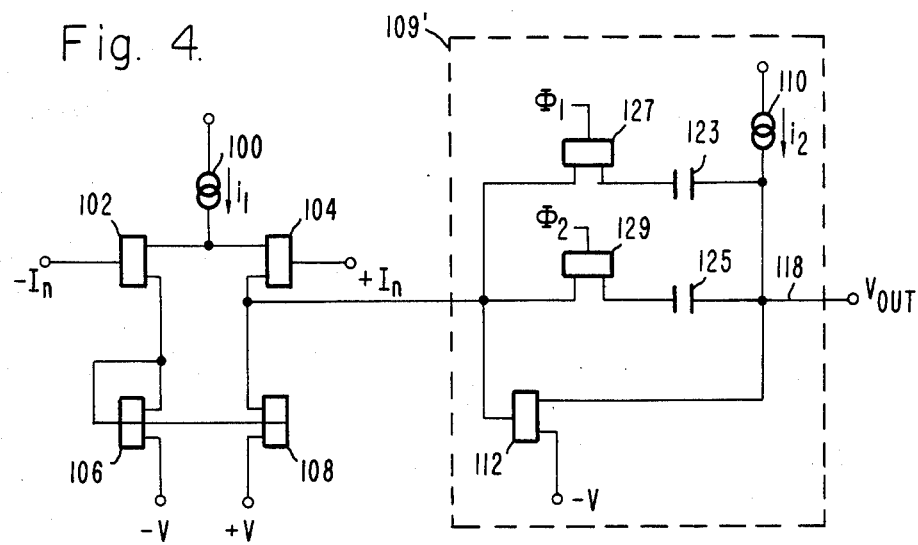
FIG. 4 is a schematic diagram of the circuit of the present invention.

As shown in FIG. 4, the improvement of the invention comprises replacing capacitor 113 of FIG. 2 by a pair of capacitors 123 and 125, each of which may be selectively switched in or out of the tracking mode by a respective switch means such as switches 127 and 129 which may comprise a pair of FET switches. The switches 127 and 129 are operated such that they are never both closed at the same time. This is accomplished by the pair of nonoverlapping clock signals $\Phi_1$ and $\Phi_2$ shown in FIG. 5. As an example, $\Phi_1$ could be used to control switch 127. When $\Phi_1$ is high, switch 127 would be closed thereby placing capacitor 123 in the circuit to track the input signal. When $\Phi_1$ is high, $\Phi_2$ is low and switch 129 is open. Thus capacitor 125 would be out of the circuit and would retain or "hold" the voltage level that it had reached during the last time it was in the circuit (i.e, when switch 129 was closed). Of course, for proper operation, $\Phi_1$ and $\Phi_2$ must be operated in synchronism with the signal $\Phi$ of the circuit of FIG. 1.

An example may serve to better illustrate the operation of the circuit of FIG. 4. Assume that the signal $\Phi$ is in its low state as during the period $t_1$ to $t_2$ of FIG. 5, this would connect capacitor 40 of FIG. 1 to ground and connect terminal 10c to the inverting input terminal 10b. Switches 54 and 56 are closed. This is the "reset" mode of the circuit of FIG. 1. During this same time period $\Phi_1$ is low, causing switch 127 to be open, thus removing capacitor 123 from the circuit. However, $\Phi_2$ is high causing switch 129 to be closed, thus putting capacitor 125 into the circuit to "track" the reference voltage. With capacitor 40 switched to ground, the only output voltage will be the offset voltage, i.e., $V_{ref}$. Therefore, the output voltage $V_{out}$ shown in FIG. 6 will be held to $V_{ref}$ and stored on capacitor 125.

Figure 5:
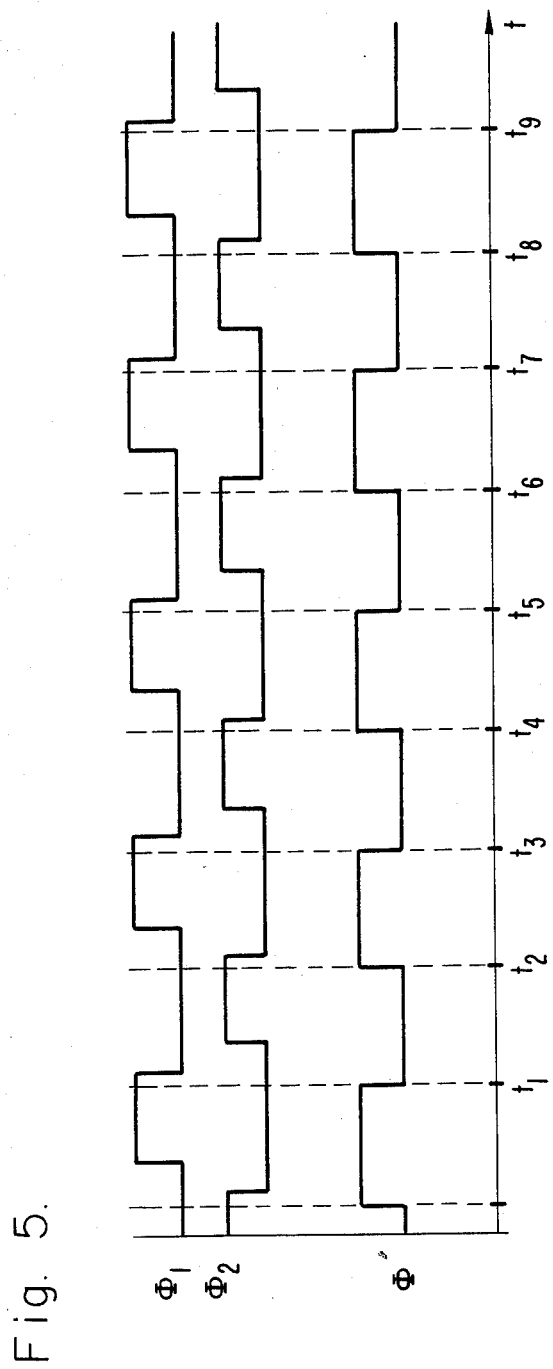
FIG. 5 is a representation of the non-overlapping external clock signals used in the circuit of FIG. 4.

At time $t_2$, $\Phi$ goes to its high state for the period $t_2$ to $t_3$ of FIG. 5. This connects capacitor 40 to the input voltage $V_{in}$ and connects output terminal 10c to plate 42b of capacitor 42. Switches 54 and 56 are opened. This is the "sample" mode of the circuit of FIG. 1. During this same time period $\Phi_1$ is high, causing switch 127 to be closed, thus switching capacitor 123 into the circuit, $\Phi_2$ is low causing switch 129 to be open, thus switching capacitor 125 out of the circuit where it will retain the voltage level $V_{ref}$. When capacitor 123 is switched into the circuit, the voltage stored across it will be nearly the same as reached during the previous sample period which ended at $t_1$. Since the input voltage at $t_1$ was nearly the same as $V_{ref}$, the voltage stored across capacitor 123 will be nearly the same as the voltage stored across capacitor 125. Consequently, the output voltage will not be driven to a substantially different value as a result of the voltage stored across capacitor 123. Capacitor 123 then begins to charge or discharge toward the current value of $V_{in}$. However, the capacitor 123 can change voltage only at a maximum rate dV/dt equal to the slew rate $I_1/C_{s1}$ where $C_{s1}$ is the value of capacitor 123. Thus the output voltage begins to rise at the input stage limited slew rate and at point A of FIG. 6 nears $V_{in}$ and thereafter settles into and tracks $V_{in}$.

At time $t_3$ of FIG. 5, Φ changes to its low state for the time period $t_3$ to $t_4$. This connects capacitor 40 of FIG. 1 to ground and connects the output terminal 10c to the inverting input terminal 10b. Switches 54 and 56 are closed. During this same time period $t_3$ to $t_4$, $\Phi_1$ is low causing switch 127 to be open, thus removing capacitor 123 from the circuit. Capacitor 123, while removed during this period $t_3$ to $t_4$, will retain the last voltage level which it had reached, i.e., the voltage at just prior to time $t_3$. When $\Phi_1$ is low, $\Phi_2$ is high, causing switch 129 to close and switch capacitor 125 into the circuit. When capacitor 125 is switched into the circuit, the output voltage $V_{out}$ slews at a high rate, limited only by the output stage slew rate, not the input stage slew rate. It then settles to the value of the voltage previously stored in capacitor 125, which is $V_{ref}$. Thus, $V_{out}$ is not required to slew back to $V_{ref}$ at a rate determined by the input stage slew rate limit as was the case in FIG. 3 for the time period $t_3$ to point B. $V_{out}$ will thus accurately track $V_{ref}$ for most of the period $t_3$ to $t_4$.

At time $t_4$ in FIG. 5, Φ changes from low to its high state and stays in its high state for the period $t_4$ to $t_5$. This again connects capacitor 40 to the input voltage $V_{in}$ and connects output terminal 10c to plate 42b of capacitor 42. Switches 54 and 56 are closed. $\Phi_1$ goes to high closing switch 127 and switching capacitor 123 into the circuit. $\Phi_2$ is now low, switching capacitor 125 out of the circuit, where it retains its level $V_{ref}$. As capacitor 123 is switched into the circuit, it still has stored on it the last voltage level reached during the previous sample period, $t_2$ to $t_3$. As soon as capacitor 123 is switched into the circuit, $V_{out}$ slews at a high rate, limited only by the output stage slew rate, not the input stage slew rate, from $V_{ref}$ to the value previously stored on capacitor 123, i.e., the high voltage level shown in FIG. 6 at time $t_3$. $V_{out}$ thus begins to rise at the output stage slew rate limit until at point D it nears the level of, and begins to settle toward, $V_{in}$. The time duration required to slew to near the level of $V_{in}$, i.e., the time $t_4$ to point D, is significantly less than the corresponding slew time required by the circuit of FIG. 2, which time is shown as the period $t_4$ to D in FIG. 3. Correspondingly, the time that $V_{out}$ settles to and tracks $V_{in}$ is much greater in FIG. 6 (i.e., point D to E) than in FIG. 3 (point D to E). Note that in FIG. 3, because of the slew rate limitation, $V_{out}$ never reaches $V_{in}$ during the $t_4$ to $t_5$ interval.

At time $t_5$, Φ drops to its low state, $\Phi_2$ goes high, and $\Phi_1$ goes low. $V_{out}$ thus slews at a high rate from its value at point E to $V_{ref}$, as explained for time $t_3$ above.

Figure 6:
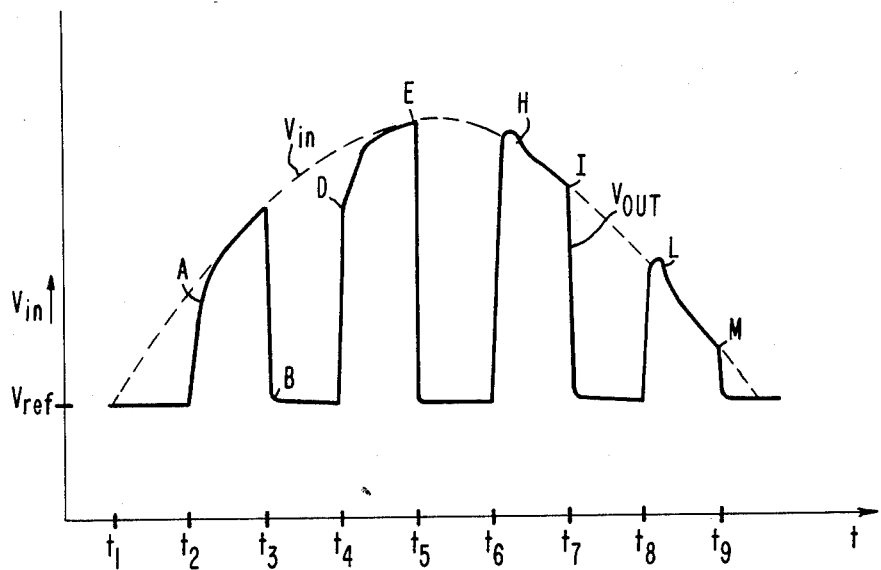
FIG. 6 is a diagram of the output waveform resulting from use of the circuit of FIG. 4.

At times $t_6$ and $t_8$ as shown in FIG. 5, Φ goes high and $\Phi_1$ goes high switching capacitor 123 into the circuit. In each case, the voltage stored in capacitor 123 is higher than the current level of $V_{in}$. Thus, $V_{out}$ begins at $V_{ref}$ and slews at a rapid rate toward the previously stored value of $V_{in}$. It may go above the value of $V_{in}$ and slews back down toward $V_{in}$ at the rate of $-I_{s1}/C_{s1}$ until it gets relatively close to $V_{in}$ and then gradually settles into and tracks $V_{in}$ as at points H and L. The output waveform shown in FIG. 6 can readily be compared to the output waveform of FIG. 3. It is apparent that $V_{out}$ of FIG. 6 tracks the desired voltage levels $V_{ref}$ and $V_{in}$ for a greater percentage of the time period $t_1$ to $t_9$ than does $V_{out}$ of FIG. 3. $V_{out}$ of FIG. 6 is required to slew from one voltage level to another for much less time than required in FIG. 3. Although the input slew rate limit dV/dt is the same for the circuits of FIG. 2 and FIG. 4, the output $V_{out}$ of FIG. 6 requires less time for slewing.

Since the voltage level stored on capacitor 123 is generally going to be closer to the next sampled value of $V_{in}$ than is the reference voltage $V_{ref}$, the slewing time of the circuit of FIG. 4 will generally be less than the slewing time of the circuit of FIG. 2. The output $V_{out}$ will thus show greater correlation with $V_{in}$ for the circuit of FIG. 4 than was achieved by the circuit of FIG. 2.

The improvement in slewing time may be computed as follows:

Let the slewing time of the prior art circuit of FIG. 2 be designated Tso. Let Vd equal the voltage difference between the reference voltage level $V_{ref}$ and the voltage level of the desired output voltage waveform $V_{in}$. Then:

$$Tso = Vd/(dV/dt_{max}) \qquad (1)$$

where $dV/dt_{max}$ has been previously defined as the maximum slewing rate sized by $I_1/C_s$.

Let the input stage limited slewing time of the new and improved circuit be designated Tsn. Let $\Delta V_{out}$ be the maximum voltage through which the new circuit must slew at the input stage limited slew rate $dV/dt_{max}$. Assume (see FIG. 6) that the time required to slew, at the output stage limited slew rate, to the previously stored voltage is small in comparison to Tsn. Then:

$$Tsn = \Delta V_{out}/(dV/dt_{max}) \qquad (2)$$

Note that $\Delta V_{out}$ represents the difference between signal output voltage levels occurring over the time interval in which the reference voltage is present at the amplifier output. This time interval is usually $T_{clk}/2$ where $T_{clk}$ is the clock period (i.e., the period of the externally supplied clock pulse train). Where $V_{out}$ is a sine wave (with frequency $\omega_s = 2\pi f_s$) described by:

$$V_{out} = V_d \sin \omega_s t,$$

it can be shown that $\Delta V_{out}$ has a maximum value given by:

$$\Delta V_{outmax} = (T_{clk}/2) \cdot \omega_s V d \qquad (3)$$

where $\omega_s V d$ is equal to the maximum slope of the output sine wave.

In typical switched capacitor filter applications, and in the switched capacitor application of the invention, the clock frequency $f_c$ is usually several times (e.g., usually 10 times) the mid band frequency $f_s$. Thus, if $$f_c/f_s = n \qquad (4)$$

then n is much greater than 1. (n >> 1).

Using the above equations, the improvement in slewing time can be written as the old slew time divided by the new slew time, or from (1) and (2)

$$(T_{so}/T_{sn}) = (V_d/\Delta V_{out}) \quad (5)$$

But from (3), $$T_{so}/T_{sn} = (2/T_{clk})(V_d/\omega_s V_d) \quad (6)$$

Substituting $2\pi f_s$ for $\omega_s$ and $1/f_c$ for $T_{clk}$ yields $$(T_{so}/T_{sn}) = (f_c/\pi f_s) \quad (7)$$

Substituting (4) into (7) gives the final result $$(T_{so}/T_{sn}) = (n/\pi) \quad (8)$$

In the typical case where n is 10, the improvement factor is $10/\pi$ or about a factor of 3 reduction in slewing time. This reduction in slewing time can be used to great advantage. For example, the reduced slewing time typically permits the same amplifier to be used at more than double the clock rate. That is, a circuit using the present invention can utilize values for n which are twice that of the old circuit and thereby significantly reduce distortion produced by sampling as in switched capacitor filter circuit applications. Similarly, equivalent results can be obtained by the new circuit even if the current limited slew rate, and therefore the power supplied to the operational amplifier, is reduced by about 50%. Thus, by using the design of the present invention, great flexibility is achieved. The three factors, tracking capability, clock rate and power consumption can be balanced against one another and traded off to achieve the most desired output waveform characteristics.

It should be noted that if the external feedback network around the operational amplifier, as shown in FIG. 1 is switched from one configuration to another, an optimum value for capacitors 123 and 125 can be chosen for each configuration of the feedback network.

Figure 7:
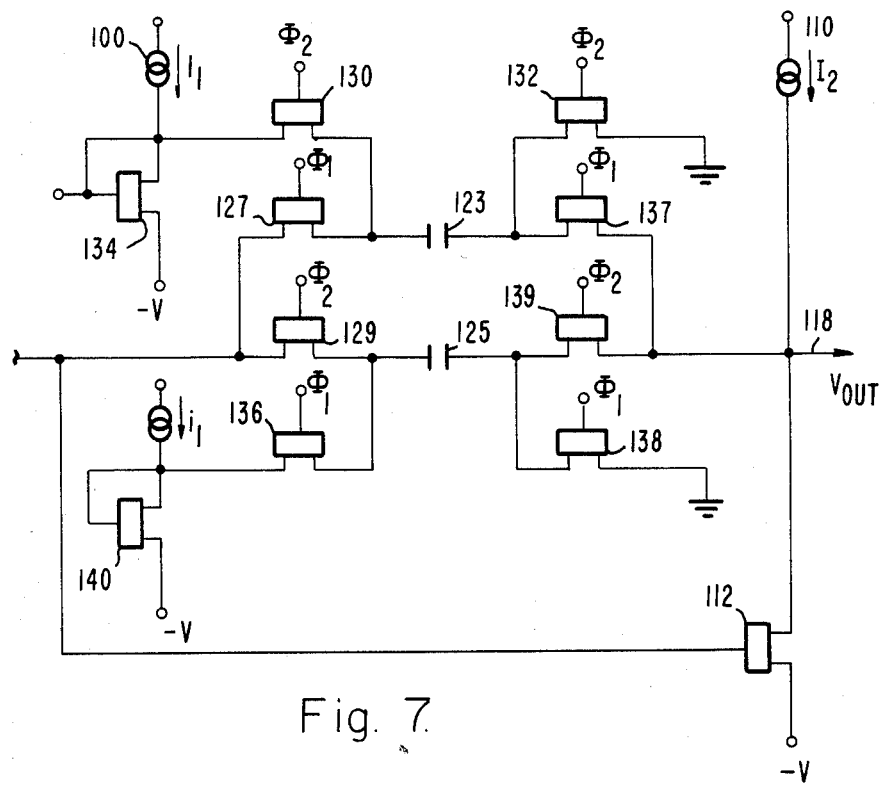
FIG. 7 is a schematic diagram of an alternate embodiment of the invention.

An alternate embodiment of the invention is shown in FIG. 7. The alternate embodiment is a more versatile version of the circuit of FIG. 4. The increased versatility is achieved by adding switching devices such as switches 137 and 139 on the other side of the respective capacitors 123 and 125. This permits complete isolation of capacitors 123 and 125 from the remainder of the circuit. By further adding switch devices 130 and 132 and properly biasing FET 134, capacitor 123 may be precharged to a selected voltage level while capacitor 125 is switched into the circuit. Similarly, by adding switch devices 136 and 138 and properly biasing FET 140, capacitor 125 may be precharged to a selected voltage level while capacitor 123 is switched into the circuit. The added switches 137, 132 and 130, and the biasing FET 134 may be referred to generally as a precharging means for capacitor 123. By precharging the capacitors 123 and 125, the output voltage $V_{out}$ may be caused to return to any desired voltage level whenever the non-overlapping clock signals change state. Thus, $V_{out}$ can be caused to slew rapidly toward a reference level other than the last stored value of $V_{ref}$ (shown in FIG. 6) during the "reset" period such as $t_3$ to $t_4$, and $V_{out}$ may also be caused to slew rapidly to any predetermined level, independent of the last sampled value of $V_{out}$, as was the case at times $t_4$ to $t_5$ when the sample period begins. The above described operation may be readily understood by noting that when $\Phi_1$ is high and $\Phi_2$ is low, capacitor 123 is switched into the circuit and capacitor 125 is switched out of the circuit and into the precharge configuration. Capacitor 125 precharges through switches 136 and 138 to ground (or another predetermined reference). Conversely, when $\Phi_1$ is low and $\Phi_2$ is high, capacitor 123 is switched out of the circuit and into the precharge mode while capacitor 125 is switched into the circuit.

The circuit of FIG. 7 can easily be operated to perform identically to the circuit of FIG. 4. This is accomplished by not applying any clock signal $\Phi_1$ or $\Phi_2$ to switches 130, 132, 136, 138, which thus remain open, and driving switches 137 and 139 with a voltage which will keep the switches constantly closed. The configuration of the circuit of FIG. 7 then becomes electrically equivalent to the circuit of FIG. 4.

There has thus been described an improved circuit for the output stage of an operational amplifier intended for use in a sample and reset circuit. The improved circuitry greatly improves the apparent slew rate of the operational amplifier. In an alternate embodiment, additional provision is made to allow precharging the capacitor voltages such that the output voltage $V_{out}$ can be caused to return to a desired voltage level each time the circuit changes from one state ("sample" or "reset") to the other.

While the invention and an alternate embodiment have been described with particular reference to FIGS. 4 through 7, the figures are for purposes of illustration only and should not be interpreted in a limiting sense. Various modifications to the invention could be made by one skilled in the art without departing from the scope of the invention as defined by the appended claims. For example, the phasing of switch 50 in FIG. 1 could be reversed to obtain a sample and hold circuit. The non-overlapping clock pulse trains could also be a single clock pulse train, the high level of which would serve to close those switches driven by $\Phi_1$ and open those switches driven by $\Phi_2$. This could be accomplished by appropriate selection of FETs as either P-type or N-type as required. In such a case, the signal $\Phi$ used to select the operating mode of the circuit of FIG. 1 could be used to serve the function of the non-overlapping pulse trains $\Phi_1$ and $\Phi_2$.

What is claimed is:

1. In an operational amplifier, including an output stage amplifier and a stabilization capacitor connected between the output terminal of said output stage amplifier and a terminal of said output stage amplifier which is utilized for receiving input signals, said operational amplifier controlled by a clock pulse train so as to output a first signal in a first operating mode and to output a second signal in a second operating mode, the improvement comprising:
    a first switch connected in series with, and to one terminal of, said stabilization capacitor;
    a second switch;
    a second capacitor connected serially to said second switch at one terminal of said second capacitor;
    said second switch and connected second capacitor being connected in parallel, with said first switch and stabilization capacitor, between said terminal for receiving input signals and the output terminal of said output stage amplifier; and
    at least one external clock pulse train coupled to and controlling said first and second switches.

2. The improvement according to claim 1 wherein said first and second switches are electronic switches.

3. The improvement according to claim 1 wherein said at least one external clock pulse train comprises a pair of non-overlapping clock pulse trains.

4. The improvement according to claim 1 and further comprising:
- a third switch connected to and in series with said stabilization capacitor and to that terminal of said stabilization capacitor which is not connected to said first switch;
- a fourth switch connected to and in series with said second capacitor and to that terminal of said second capacitor which is not connected to said second switch; and wherein
- said external clock pulse train is coupled to and controls said third and fourth switches such that the state of said third switch is the same as the state of said first switch and the state of said fourth switch is the same as the state of said second switch.

5. The improvement according to claim 4 and further comprising:
- first precharge means coupled to said stabilization capacitor for precharging said capacitor to a desired voltage level;
- second precharge means coupled to said second capacitor for precharging said second capacitor to a desired voltage level; and
- said first precharge means being activated when said first and third switches are open and said second precharge means is inactivated and said second precharge means being activated when said second and fourth switches are open and said first precharge means is inactivated.

6. An operational amplifier having an output stage amplifier, with a terminal for receiving input signals and an output terminal, controlled by a clock pulse train so as to output a first signal in a first operating mode and to output a second signal in a second operating mode, and further comprising:
- a first switch connected in series with a first capacitor;
- a second switch connected in series with a second capacitor;
- said first switch and the connected first capacitor being connected in parallel to said second switch and the connected second capacitor between said terminal for receiving input signals and said output terminal of said output stage amplifier; and
- said clock pulse train is coupled to and controls said first and second switches such that they are not both in the closed state simultaneously.

7. The operational amplifier according to claim 6 and further comprising:
- a third switch connected to and in series with said first capacitor and to that terminal of said first capacitor which is not connected to said first switch;
- a fourth switch connected to and in series with said second capacitor and to that terminal of said second capacitor which is not connected to said second switch; and wherein
- said clock pulse train is coupled to and controls said third and fourth switches such that the state of said third switch is the same as the state of said first switch and the state of said fourth switch is the same as the state of said second switch.

8. In an operational amplifier comprising an output stage amplifier having a terminal for receiving input signals and an output terminal, and a clock pulse train for triggering said operational amplifier to alternatley change from a first operating mode in which the output voltage of said output stage amplifier tends to return to a reference voltage level, to a second operating mode in which the output voltage of said output stage amplifier tends to track an input voltage signal, an improvement to said output stage amplifier comprising:
- a first switch connected in series with a first capacitor;
- a second switch connected in series with a second capacitor;
- said second switch and connected second capacitor being connected, in parallel with said first switch and connected first capacitor, between said terminal for receiving input signals and said output terminal; and
- said clock pulse train is coupled to and controls said first and second switches such that said first and second switches are not both in the closed state simultaneously.

* * * * *